(12) United States Patent
Freeman et al.

(10) Patent No.: US 7,179,335 B2
(45) Date of Patent: Feb. 20, 2007

(54) IN SITU ADAPTIVE MASKS

(75) Inventors: William Freeman, Castro Valley, CA (US); Yin Zhang, San Jose, CA (US); Lillian Qin, Vancouver (CA)

(73) Assignee: Finisar Corporation, Sunnyvale, CA (US)

( * ) Notice: Subject to any disclaimer, the term of this patent is extended or adjusted under 35 U.S.C. 154(b) by 175 days.

(21) Appl. No.: 10/695,343

(22) Filed: Oct. 28, 2003

(65) Prior Publication Data

US 2004/0142625 A1    Jul. 22, 2004

Related U.S. Application Data

(60) Provisional application No. 60/421,883, filed on Oct. 28, 2002.

(51) Int. Cl.
*C23C 14/04*    (2006.01)

(52) U.S. Cl. .................. 118/720; 118/721; 204/298.11

(58) Field of Classification Search ................ 118/720, 118/721; 204/298.11, 298.41
See application file for complete search history.

(56) References Cited

U.S. PATENT DOCUMENTS

| | | | | |
|---|---|---|---|---|
| 4,256,532 A | * | 3/1981 | Magdo et al. ................. 216/2 |
| 4,704,306 A | * | 11/1987 | Nakamura ................... 427/100 |
| 4,919,749 A | * | 4/1990 | Mauger et al. ................ 216/12 |
| 5,186,975 A | * | 2/1993 | Tizabi et al. ................ 427/96.8 |
| 5,282,944 A | * | 2/1994 | Sanders et al. ......... 204/192.38 |
| 5,840,163 A | * | 11/1998 | Welty ..................... 204/192.38 |
| 5,904,961 A | * | 5/1999 | Tang et al. .................. 427/561 |
| 6,027,619 A | * | 2/2000 | Cathey et al. .......... 204/192.38 |
| 6,132,805 A | * | 10/2000 | Moslehi ................... 427/248.1 |
| 6,139,964 A | * | 10/2000 | Sathrum et al. ............ 428/408 |

* cited by examiner

*Primary Examiner*—Richard Bueker
(74) *Attorney, Agent, or Firm*—Workman Nydegger

(57) ABSTRACT

A variable adaptive mask is provided that can be dynamically modified in situ in a physical vapor deposition process. The mask comprises a fixed mask portion, a plurality of channels extending through the fixed mask portion, a control mechanism for controlling throughput of a vaporized target material through the channels, and a mechanism to mount the mask in a fixed position relative to a solid target material and a substrate. In one embodiment, a magnetic control mechanism is provided to control throughput of the vaporized target material through the channels. In another embodiment, a thermal control mechanism is provided to control throughput of a vaporized target material through the channels. Methods of controlling a physical vapor deposition process using the adaptive mask are also disclosed.

13 Claims, 7 Drawing Sheets

IN SITU ADAPTIVE MASKS

This application claims the benefit of priority to U.S. Provisional Application No. 60/421,883, filed on Oct. 28, 2002, the disclosure of which is incorporated by reference herein.

BACKGROUND OF THE INVENTION

1. The Field of the Invention

This invention relates generally to the field of physical vapor deposition for creating thin films on a substrate. In particular, embodiments of the present invention relate to a dynamically adaptable mask for use in a physical vapor deposition process.

2. The Relevant Technology

Physical vapor deposition (PVD) is a process for depositing specific "target" materials onto a substrate. The process generally involves liquefying or vaporizing a portion of the target material such that it is eventually deposited onto the substrate. Generally, if chemical reactions are taking place at the substrate by design, then the process is usually called chemical vapor deposition (CVD). If the material is collecting on the surface and not much more than nucleation is going on, as in the case of most metals deposition, then the process is called PVD. The PVD process is commonly used in the field of optics to deposit thin films of specific materials onto substrates. These thin films generally have optical properties such as reflection, transmission, absorption, or polarization. The process can also be used to deposit specific patterns of materials onto a substrate for the purpose of creating optical or electrical effects. For example, a specific pattern can be deposited on a geometrical optical element for only reflecting light that is contained within the specific pattern deposited by the PVD process.

There are many different techniques for providing the necessary bond-breaking energy to the molecules within the target material to initiate the necessary state change. The most common PVD techniques are flash evaporation, electron beam (E-beam) evaporation, ion-plating, and pulsed laser deposition (PLD). Flash evaporation involves heating up a container device to a temperature above the melting point of the target material. The target material is then slowly inserted into the container in a delayed manner such that all of the previously inserted target material has evaporated before more is inserted. Flash evaporation generally causes some undesirable splattering of the target material. The most common form of flash evaporation is a simple coiled filament, not unlike what is found in light bulbs and vacuum tubes. For flash evaporation, the filament current is pulsed way beyond that required to melt the material and it explosively evaporates. Sometimes the material is coated on a much more refractory filament material, and sometimes the material is heated to just below the melting point such that enough material sublimes from the hot filament to do a slow deposition.

E-beam evaporation requires the target material to be placed in a water cooled container. A specific portion of the target material is then heated by a powerful high voltage electron beam. The electron beam has a high flux causing the specific portion of the target material to be sublimated while the remaining target material is cooled by the water cooled container. Sublimation refers to heating up a solid material so as to cause it to skip the liquid phase and instantly become vaporized. Unfortunately, this technique requires large amounts of energy to be used in powering the electron beam source. While some materials do sublime, most melt and evaporate since there is usually a significant temperature difference between the melting point and the boiling point. Also, to keep from forming pockets and distorting the evaporation plume profile, as well as reduce the particulates, the beam is scanned across the surface of the target so that the target erodes as evenly as possible.

In ion plating, the target material is evaporated into a plasma state by an energy source, such as a high voltage electron beam. The evaporated material alternates between a charged state as positive ions and an uncharged state as neutral atoms. When the evaporated material is in the positive ionic state, the plasma affects the transport of the molecules so that it appears to the substrate that the plasma is a diffuse source of the evaporated target material rather than the evaporation source itself. Long-term use of this process poses significant obstacles in preventing the energy source from being corroded by the plasma. Like E-beam evaporation, this process also requires a tremendous amount of energy to power the energy source required to maintain the necessary heat to keep the target material in a plasma state.

Pulsed laser deposition (PLD) is emerging as one of the most popular forms of PVD for many reasons. It has been determined that PLD can be used to deposit complex combinations of elements or other substances in their original composition onto a substrate. This is extremely important because different elements each have unique melting points, meaning that it is difficult to proportionally vaporize all of the materials within a composition. This is achieved by using non-equilibrium surface heating of the multi-element composition target material. Other PVD processes are not capable of precisely controlling the uniformity of heat from the source to the target material. In addition, PLD is generally able to precisely deposit portions of target material with less contamination problems than other PVD processes. This precision is important for depositing specific patterns of target material on a substrate.

Contamination is a problem when external compositions are deposited onto the substrate in addition to the target material. For example, if a PVD process utilizes a ceramic container to contain the liquid target material before it is deposited, a foreign substance may vaporize within the ceramic material and be added to the target material.

Pulsed laser deposition uses a laser beam to provide the necessary bond-breaking energy to the target material. A portion of the target struck by the laser is evaporated. The wavelength of the laser affects the depth at which the laser is absorbed and the amount of target material which is consequently heated. For example, ultraviolet radiation is typically absorbed to a shallow depth of about 1,000 Å. The laser is pulsed so as to not continue boring a hole through the target material. The key to successful ablation is power density. Thus, a lot of power is used generally for a short period of time so that one does not bore a hole through the target material. The high power can be achieved by focusing or other methods but it is the energy per unit time in a given area that determines the effectiveness of PLD—Joules/sec/cc. Thus, the ablation increases when the energy is increased, the time, pulse duration, is shortened, or the volume is made smaller. The surface of the target material is rapidly heated up to thousands of degrees Celsius, while the bottom of the target material remains at approximately room temperature. This non-uniform heating of the target material causes a flash of evaporants to be released. The evaporants of target material form a "plume" and are eventually deposited onto the substrate. The resulting deposit on the substrate will be a thin film with exactly the same composition as the target material.

It is common to use masks with physical vapor deposition processes, which enable material to be selectively deposited over the regions of a substrate that are exposed through the mask. All PVD processes utilize some form of source for generating the necessary bond-breaking energy to deposit the target material onto a substrate. Unfortunately, almost all sources exhibit wear and drift characteristics over time. The target also wears and changes over time. In fact, it is quite common to have more than one set of masks that are changed out according to the wear on the target. Currently, this requires interrupting the run and opening the chamber. Therefore, the characteristics of a mask that are used in conjunction with a changing source should also be capable of changing. Currently, masks are simply mechanically modified in an essentially experimental manner in an effort to compensate for these changes. Unfortunately, this process generally results in non-uniform depositions due to the crude adjustments made to the mask.

SUMMARY OF THE INVENTION

The present invention is directed to a variable adaptive mask that can be dynamically modified in situ in a physical vapor deposition process. The mask comprises a fixed mask portion, a plurality of channels extending through the fixed mask portion, a control mechanism for controlling throughput of a vaporized target material through the channels, and a mechanism to mount the mask in a fixed position relative to a solid target material and a substrate. A calibration scale can also be provided on the fixed mask portion.

In one embodiment, a magnetic control mechanism is provided to control throughput of the vaporized target material through the channels in the mask. The magnetic control mechanism comprises wires wrapped in a spiral configuration around each of the channels in the mask. The wires generate a magnetic field in the channels when electrical current is passed through the wires. One preferred embodiment is to fabricate the wires and connection circuitry as part of a multilayer substrate—LTCC, low temperature cofired ceramics, for instance.

In another embodiment, a thermal control mechanism is provided to control throughput of a vaporized target material through the channels in the mask. The thermal control mechanism comprises strips of material adjacent to the channels and having a high coefficient of thermal expansion such that the material reacts to heat by expanding. Since many substrates are heated by quartz lamps during a deposition process, appropriate compensation for heating of the mask with the substrate should be part of the calibration process.

Methods of controlling a physical vapor deposition process using the adaptive mask of the invention are also disclosed. In a method of the invention that uses a mask with a magnetic control mechanism, a magnetic field is generated in the channels, and vaporized target material particles are directed toward the channels. The particles are affected by the magnetic field which causes a portion of the particles to bend away from a central portion of the channels toward an edge of the channels. The throughput of the vaporized target material particles is directly proportional to the magnitude of the magnetic field.

In a method of the invention that uses a mask with a thermal control mechanism, the vaporized target material particles are directed toward the channels in the mask. The throughput of the vaporized target material particles is proportional to the heat applied to the adaptive mask.

These and other features of the present invention will become more fully apparent from the following description and appended claims, or may be learned by the practice of the invention as set forth hereinafter.

BRIEF DESCRIPTION OF THE DRAWINGS

In order to illustrate the manner in which the above-recited and other features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE INVENTION

In general, the present invention relates to a variable adaptive mask that can be dynamically modified in situ in a physical vapor deposition process. The adaptive mask of the invention can accommodate for periodic changes in flux and/or distribution of the particles within the stream to allow for a uniform and predictable application of a target material onto a substrate.

Reference will now be made to the drawings to describe embodiments of the invention. It is to be understood that the drawings are diagrammatic and schematic representations of the embodiments, and are not limiting of the present invention, nor are they necessarily drawn to scale.

Figure 1:
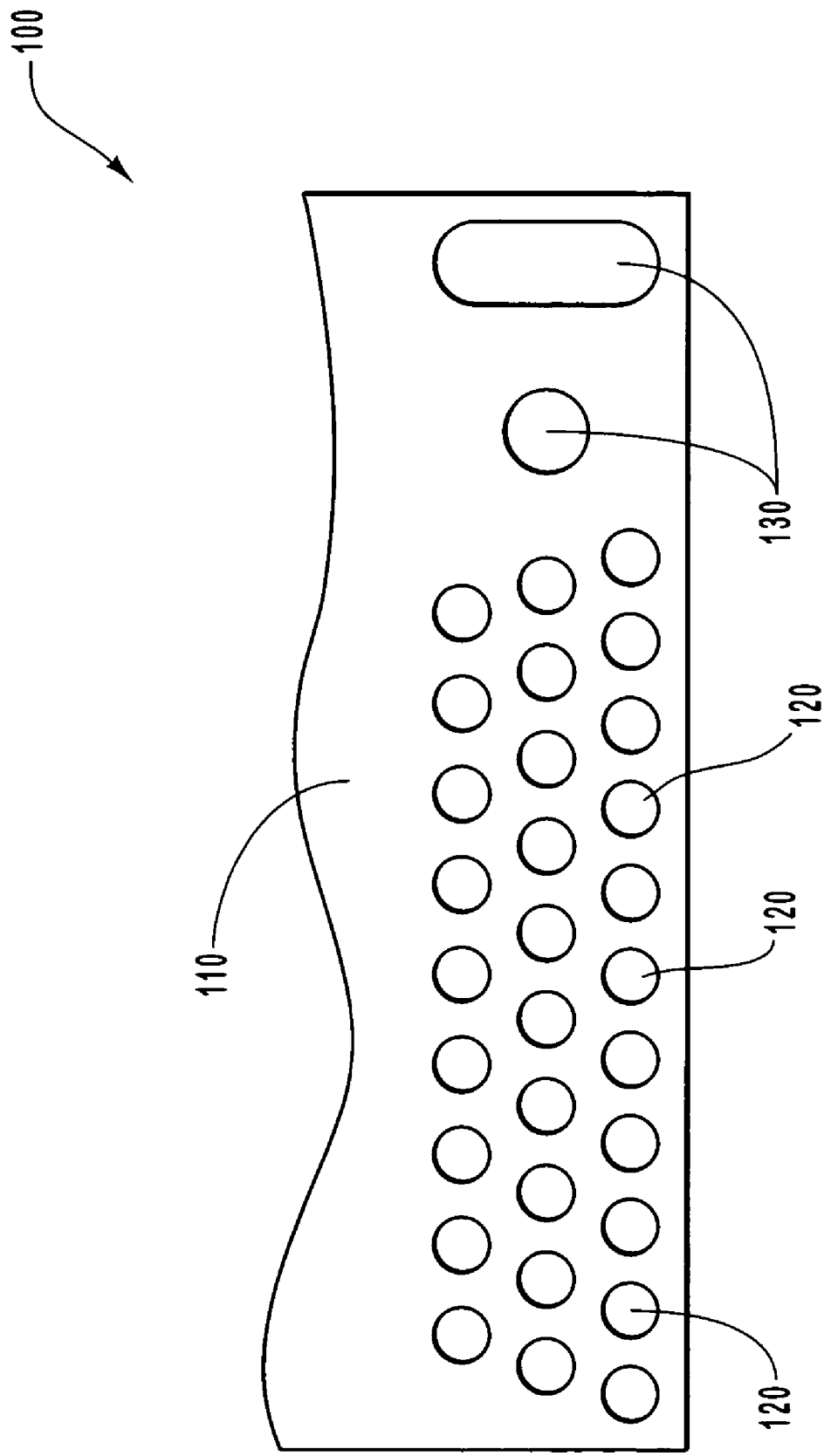
FIG. 1 is an aerial view of a magnetic embodiment of a variable adaptive mask for use with a physical vapor deposition process.

Reference is initially made to FIG. 1, which illustrates an aerial view of one presently preferred magnetic embodiment of a variable adaptive mask for use with a physical vapor deposition process, designated generally at 100. The adaptive mask 100 generally includes a fixed mask portion 110 (providing fixed mechanical tuning of the uniformity) and a plurality of channels 120 therethrough. A means for mounting the mask 100 in a fixed position relative to a solid target material and a substrate is also provided, such as one or more mounting holes 130 or other conventional mounting devices.

Figure 2:
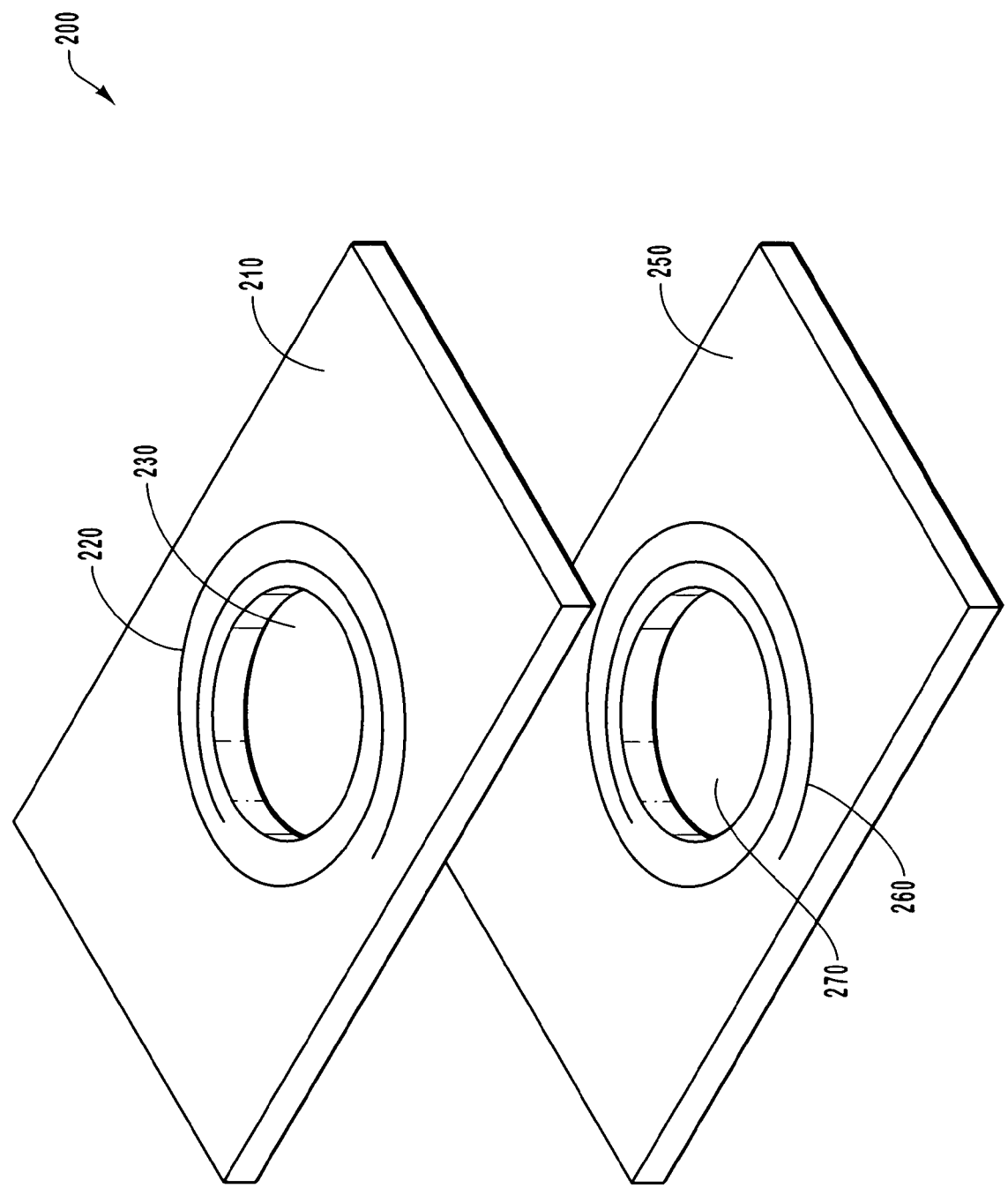
FIG. 2 is an exploded view of a two-layered single channel portion of the magnetic adaptive mask of FIG. 1.
Figure 3A:
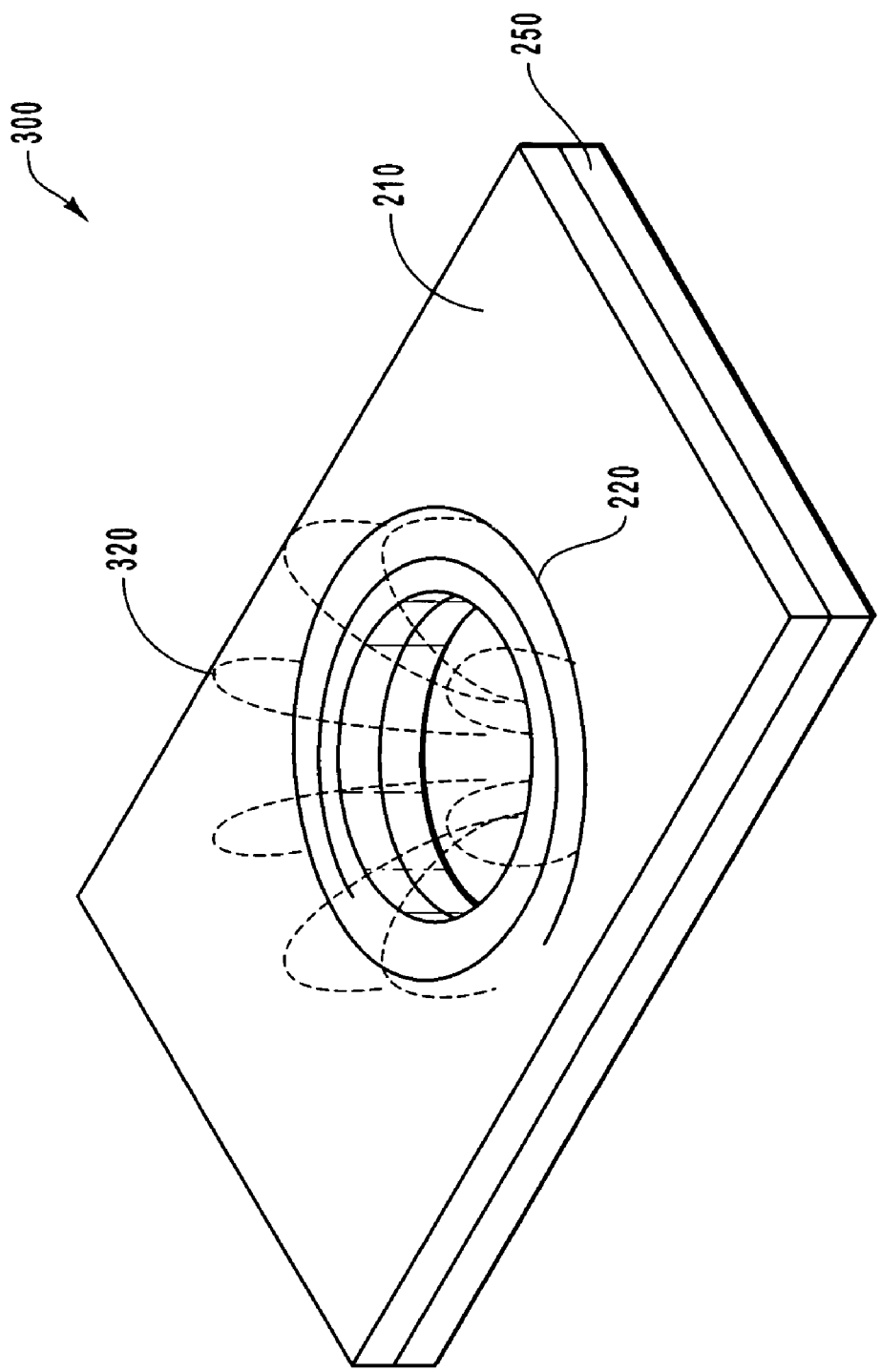
FIG. 3A is a perspective view of the magnetic field generated by a single channel portion of the magnetic adaptive mask of FIG. 1.
Figure 3B:
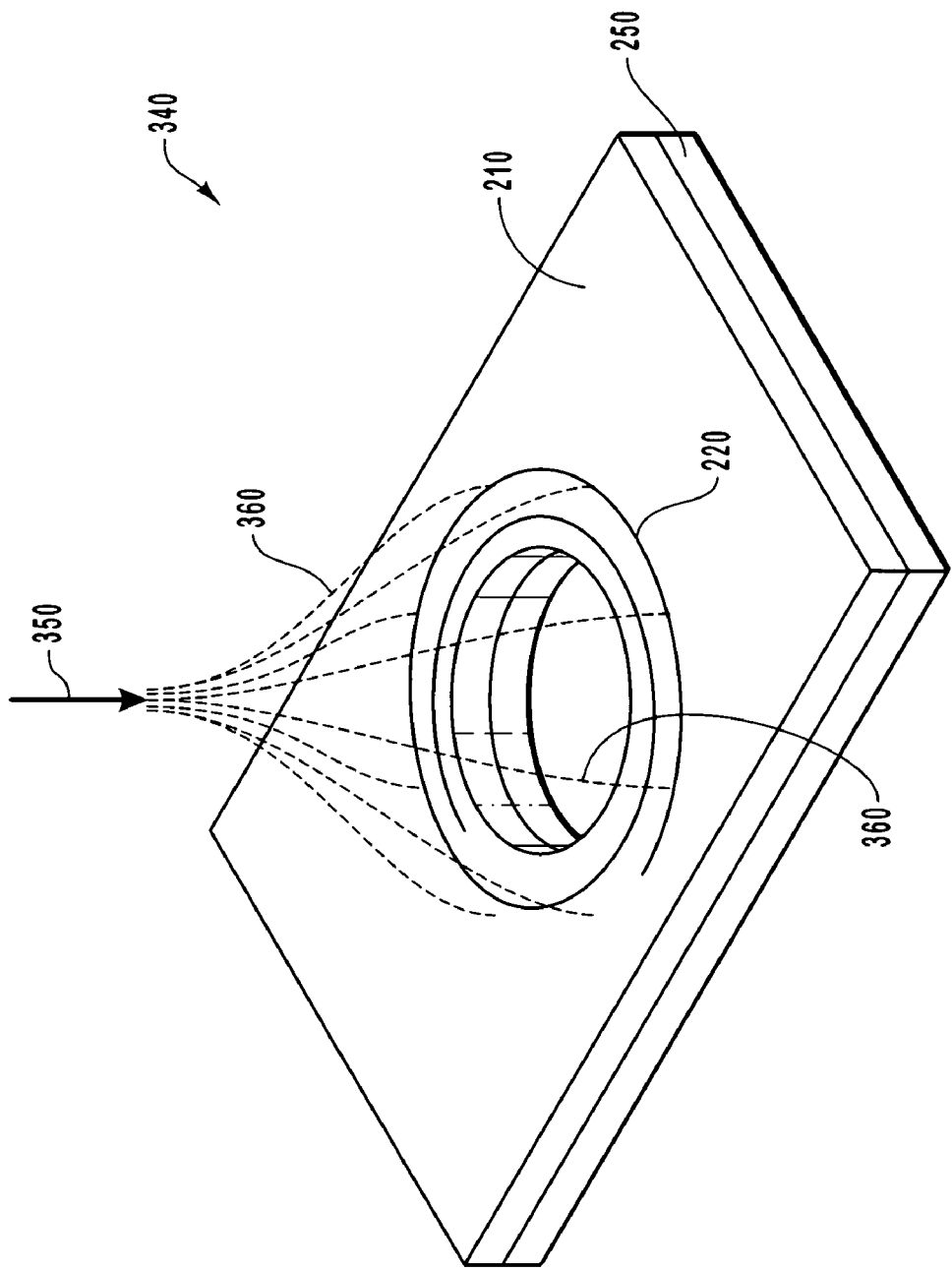
FIG. 3B is a perspective view of a single channel portion of the magnetic adaptive mask of FIG. 1 showing how target materials are affected by the magnetic field generated within the single channel.

The channels 120 are independent ports through which a target material can transmit through the mask. The ports utilize a means for controlling throughput such as a mechanism to control the amount of target material that is allowed to pass through the channels 120. FIGS. 2, 3A, and 3B illustrate a circular magnetic embodiment of a channel in which induced magnetic effects are utilized to control the amount of target material that is allowed to transmit through the illustrated channel. Alternatively, the channels 120 can be shaped as squares or any other geometrical shape. Additionally, various control mechanisms can be used for controlling the amount of target material that is allowed to transmit through the channel. The control mechanisms within each of the channels 120 are generally connected to a computer or integrated circuitry. Each channel can be independently controlled to allow for uniform or non-uniform distribution of a target material onto a substrate in a physical vapor deposition process as described above. Alternatively, the control mechanisms within each of the channels 120 can be connected together in parallel such that each of the channels are configured to allow an equal amount of target material to be transmitted therethrough. The computer or integrated circuitry is also electrically connected to a thin film (the deposited film) monitoring device, such as the calibration scale described with reference to FIG. 4. Therefore, when the characteristics of the source begin to drift or change, the computer or integrated circuitry can dynamically adjust the throughput of the channels to accommodate for changes in the deposition characteristics.

The invention is generally most effectively used in conjunction with an OMS, optical monitoring system, or the equivalent, e.g. a microbalance array. The relevant deposition characteristics would be measured real time at multiple places on the substrate and this data would be used to control the adaptive mask in a closed loop fashion. It should be noted that since the substrate is usually rotating, the monitoring generally is only one dimensional along the radius of the substrate. It should also be clear that the control can be smooth and analog-like, completely digital (on and off), or any combination of these two extremes. The reason one might choose the digital method is that a large pulse of current, in the case of magnetic deflection control, can completely block the charged particles momentarily. Thus, there may be less worry about the mask creating nonuniformities on a scale too small for the monitoring system to detect.

The mounting holes 130 are used to mount the adaptive mask 100 to a support device such that it can be held in a fixed position relative to the other components of the physical vapor deposition process. Alternatively, the support device may be configured to move the adaptive mask at precise increments with respect to the other components of the physical vapor deposition process. This movable support device may also be connected to the same computer or integrated circuit as the control mechanisms within each of the channels such that the movement of the adaptive mask can also be used to accommodate for changes in the deposition characteristics.

Reference is next made to FIG. 2, which illustrates a detailed exploded view of a two-layered single channel portion of the magnetic adaptive mask embodiment of FIG. 1, designated generally at 200. The single channel portion 200 further includes a top layer 210 and a bottom layer 250. Both the top and bottom layers 210, 250 include a hole 230, 270 and a wire 220, 260, respectively. The wires 220, 260 are wrapped in a spiral configuration around the holes 230, 270 without overlapping so as to prevent short circuits and potential capacitance effects. When an electrical current is passed through the wires 220, 260, a magnetic field is generated. One preferred embodiment is to fabricate the wires and connection circuitry as part of a multilayer substrate, such as with low temperature cofired ceramics (LTCC).

To conserve energy, a hard ferromagnetic material can be placed within the holes 230, 270. This allows a current to simply be pulsed through the wires 220, 260 to induce a temporary magnetic field upon the hard ferromagnetic material. The hard ferromagnetic material then generates a remnant magnetic field based on the hysteresis curve until a magnetic field is applied to it with the opposite polarity. This process causes the hard ferromagnetic material to form what is commonly known as a permanent magnet. Other permanent magnetic materials can also be used such as SmCo. As discussed above with reference to FIG. 1, the wires 220, 260 are connected to a computer or integrated circuit such that the magnetic field can be precisely controlled. A more detailed explanation of the magnetic field is discussed in reference to FIG. 3A, and a more detailed explanation of how the magnetic field affects the target material particles which are transmitted through the holes 230, 260 is discussed with reference to FIG. 3B.

Reference is next made to FIG. 3A, which illustrates a perspective view of the magnetic field generated by a single channel portion of the magnetic adaptive mask illustrated in FIG. 1, designated generally at 300. The combined single channel portion includes a top layer 210 and a bottom layer 250 as described in more detail with reference to FIG. 2. The magnetic field 320 generated by the permanent magnet and/or wire 220 forms a doughnut or toroidal shape around the center of the combined single channel portion.

Reference is next made to FIG. 3B, which illustrates a perspective view of a single channel portion of the magnetic adaptive mask of FIG. 1, showing how target materials are affected by the magnetic field generated within the single channel, designated generally at 340. The combined single channel portion includes a top layer 210 and a bottom layer 250 as described in more detail with reference to FIG. 2. Vaporized target material particles 360 are transmitted downward at the channel in a PVD process as illustrated by the arrow 350. The vaporized target material particles (hereinafter "particles") 360 are affected by the magnetic field illustrated in FIG. 3A. The magnetic field causes the particles to bend away from the center of the hole towards the edges of the combined single channel portion. This magnetic deflection affect can be controlled such that a desired percentage of the particles are bent away from the hole and onto the top layer 210. The particles that are bent away from the hole are reflected or absorbed within the top layer 210, whereas the particles that are allowed to transmit through the hole are eventually deposited onto the substrate (not shown). Therefore, the particle throughput of the single channel portion is proportional to the magnitude of the magnetic field.

It should be noted that the shape and pattern of the holes will determine the pattern of the deposition of the particles that pass through the mask. Clearly, these design considerations will be optimized for uniformity. With sufficient flexibility, a closed loop feedback control as mentioned earlier will virtually guarantee uniformity. The only caveat is that the monitoring system must have sufficient resolution to detect any nonuniformities created by the mask itself. What this really implies is that the mask must be designed such as to not create nonuniformities that the monitoring system cannot detect.

The particle stream from the target to the substrate includes both charged and neutral particles. Clearly, the magnetic field will not significantly affect the neutral particles. Fortunately, the amount of tuning necessary to even out the distribution is very small and even a low proportion of charged particles in the particle stream will be more than sufficient for tuning the uniformity. The reason is that the uniformity is trimmed in a more traditional manner by shaping the mask and it is only the drift over target wear, temperature, source drift, etc., that is being compensated for during a run.

Figure 4:
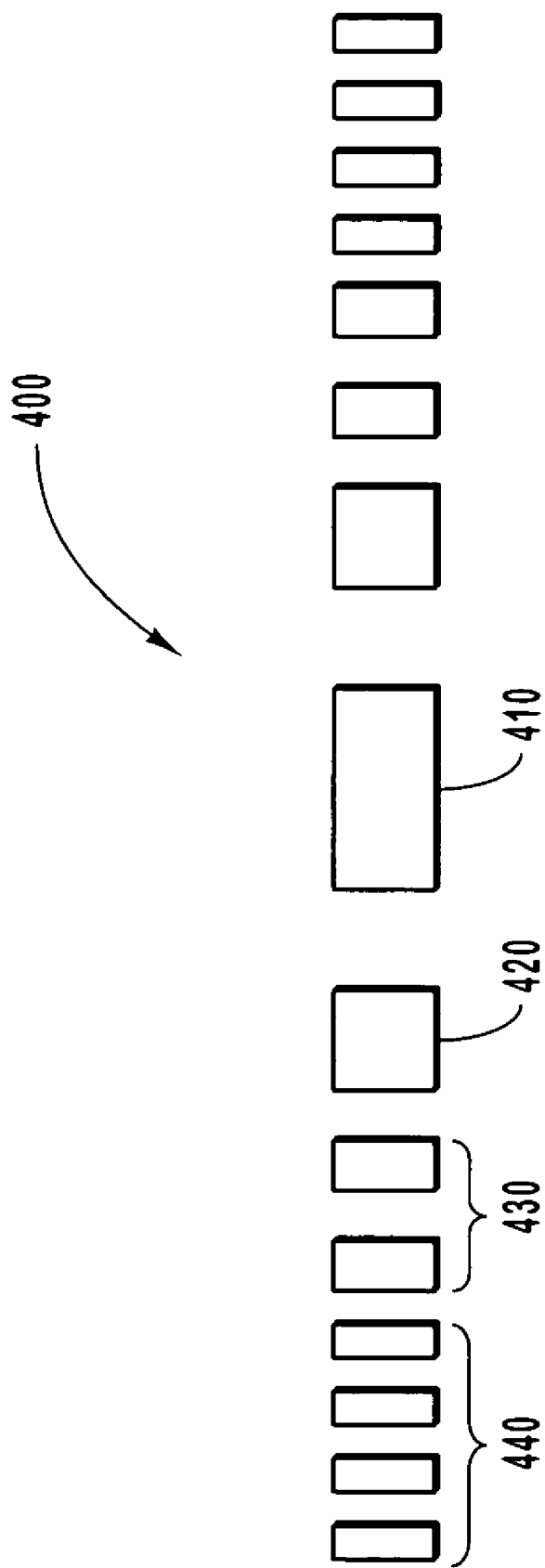
FIG. 4 is a schematic view of a calibration scale to be included on an adaptive mask.

FIG. 4 illustrates a schematic view of a calibration scale to be included on an adaptive mask, designated generally at 400. There are four sizes of alignment pads in this example, including pads 410, 420, 430, and 440. It should be understood that pad geometry and number of pad sizes can be varied as desired, as well as the particular type of progression. Vernier-like scales can also be used but will not be as efficient. Each pad of a pad set has half the area of the previous larger sized pad along the scale, and the number of pads is chosen so that the total area associated with each pad width is the same. Again, by changing the area ratios, one part of the alignment (coarse or fine) can be emphasized over the other. This can be anything from a 2 wire to 8 wire alignment. However, anything over 5 wires is redundant (one feed wire and 4 monitor wires; one for each pad size). The principle behind this scheme is the capacitive coupling between two sets of these pads. If little inductors are used, then this scheme can be inductive as well. If the pad capacitance forms part of a resonant circuit, then one simply tunes to the lowest frequency. If the frequency is in the audible range, then the alignment can be done by ear. In general, there can be one of these scale structures in both the horizontal and vertical directions. For example, a cross can be made using the central pad 410 twice, resulting in a minor savings in space. While in the diagram of FIG. 4 these pads are shown on the surface for illustration purposes, in practice they will be recessed or most likely on a buried layer. Since they need to be electrically isolated, placing the alignment pads on an inner layer not only assures that they will not contact the alignment pads on the connector but also makes cleaning the mask easier. It should be mentioned that making the mask out of multilayer ceramic materials makes periodic cleaning easier. It can be cleaned much like an ordinary mask—sand or bead blasting with the appropriate mesh and pressure.

Figure 5:
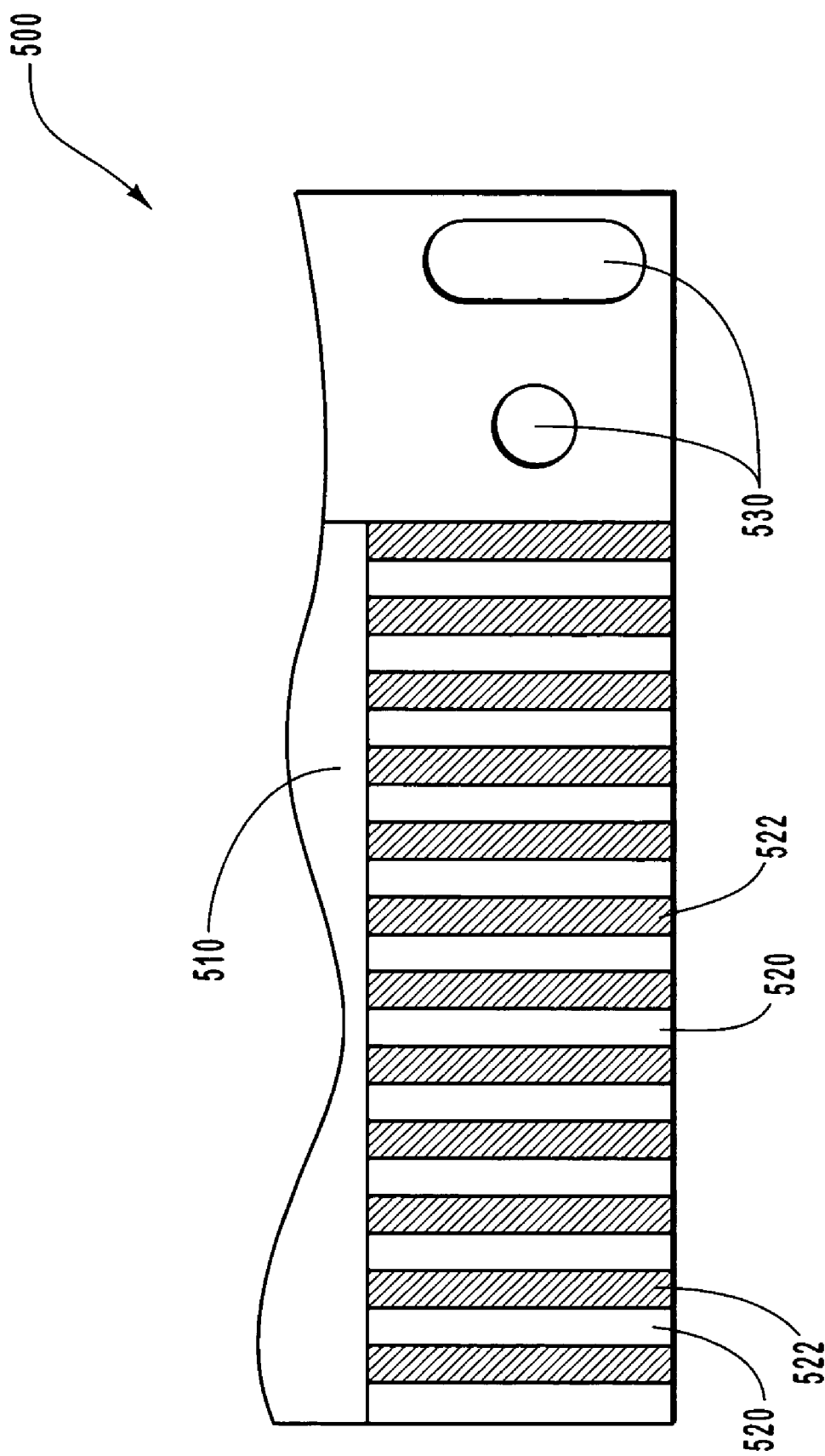
FIG. 5 shows an alternative thermal embodiment of an adaptive mask for use with a physical vapor deposition process.

Reference is next made to FIG. 5, which illustrates an alternative thermal embodiment of a variable adaptive mask for use with a physical vapor deposition process, designated generally at 500. The thermal mask 500 includes a fixed mask portion 510, a plurality of channels 520, and two mounting holes 530. The mounting holes 530 and fixed mask portion 510 are similar to the corresponding structures described in more detail with reference to FIG. 1. The plurality of channels 520 in this embodiment are significantly different from the magnetic channels illustrated in FIGS. 1–2. The channels 520 are rectangular and bordered by strips 522 formed from a material that has a high coefficient of thermal expansion (CTE) and reacts to heat by expanding. Such materials can include various metals, glasses, and ceramics with melting points of greater than about 500° C. The thermal mask 500 can be heated by thin film heating elements (not shown) to expand the strips 522 causing them to expand and consequently shrink the opening of channels 520. Therefore, by controlling the heat applied to the thermal mask 500 it is possible to control the throughput of particles that are allowed to transmit through the mask. The mask can be shaped by cutting and/or grinding to near the desired shape, and minor adjustments can then be made by thermal adjustment after the fixed mechanical shaping is done.

Figure 6:
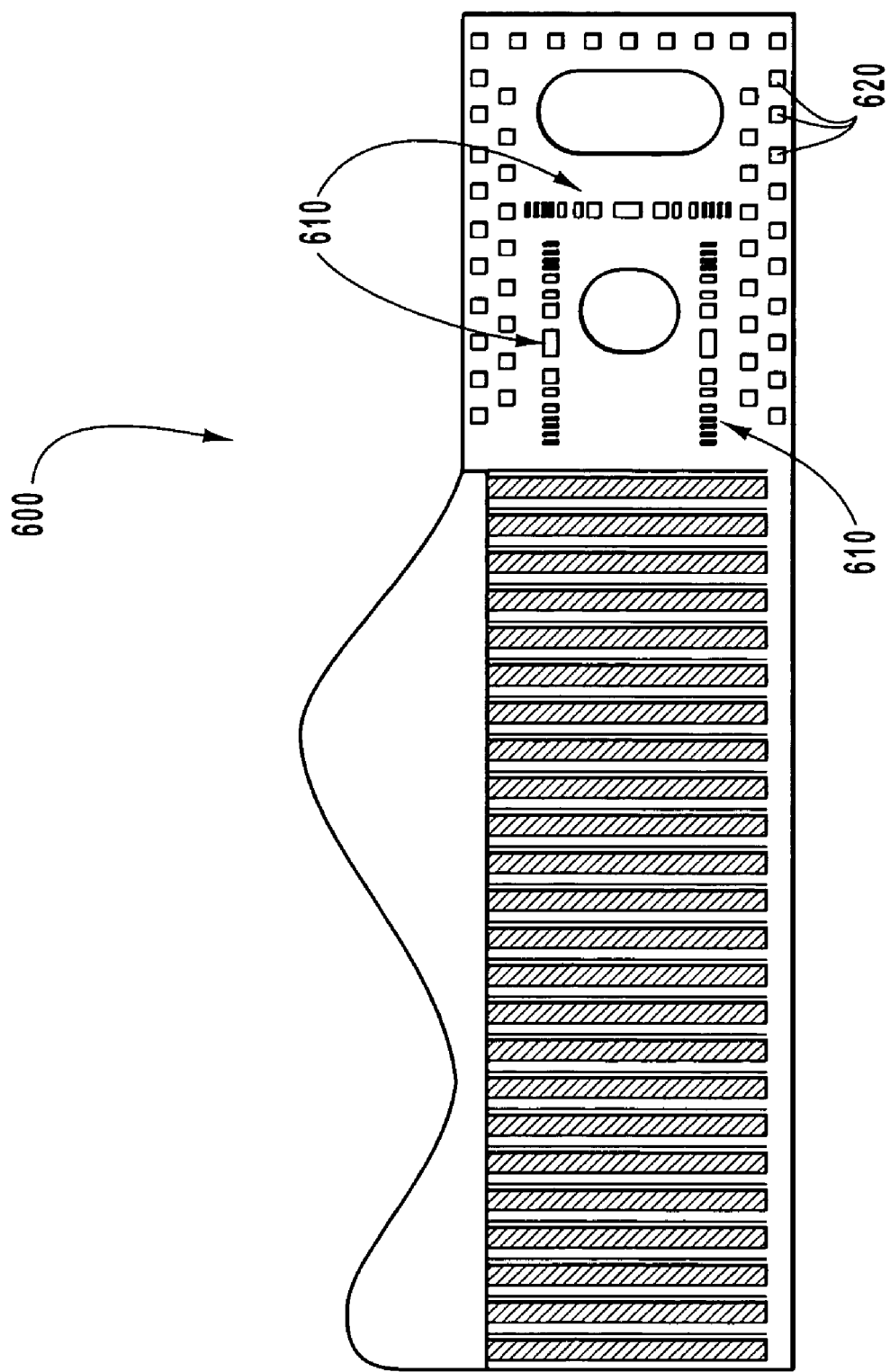
FIG. 6 shows a thermal embodiment of an adaptive mask having calibration scales thereon.

FIG. 6 shows one embodiment of how the alignment pads of FIG. 4 can be used on an adaptive mask 600. The adaptive mask 600 is similar to the thermal mask 500 of FIG. 5, except that calibration scales 610 using the alignment pads are shown on mask 600, along with connection pads 620. Since many substrates are heated by quartz lamps during a deposition process, appropriate compensation for heating of the mask with the substrate should be part of the calibration process.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A variable adaptive mask for use with a physical vapor deposition process, comprising:
   a fixed mask portion that comprises a top layer and a bottom layer;
   a plurality of channels extending through the fixed mask portion;
   a first plurality of wires positioned on the bottom layer, each wire of the first plurality of wires being disposed in a substantially spiral arrangement about a respective channel;
   a second plurality of wires positioned on the top layer, each wire of the second plurality of wires being disposed in a substantially spiral arrangement about a respective channel; and
   means for mounting the mask in a fixed position relative to a solid target material and a substrate.

2. The mask of claim 1, wherein the channels have a circular profile.

3. The mask of claim 1, wherein the channels have a rectangular profile.

4. The mask of claim 1, wherein the wires generate a magnetic field in the channels when electrical current is passed through the wires.

5. The mask of claim 4, wherein the wires are electrically connected to a computer or integrated circuit such that the magnetic field can be precisely controlled.

6. The mask of claim 1, farther comprising a hard ferromagnetic material placed within the channels.

7. The mask of claim 1, wherein the means for mounting comprises at least one mounting hole in the fixed mask portion.

8. The mask of claim 1, further comprising a calibration scale on the fixed mask portion.

9. A variable adaptive mask for use with a physical vapor deposition process, comprising:
   a fixed mask portion including a calibration scale;
   a plurality of channels extending through the fixed mask portion;
   a plurality of wires positioned on the fixed mask portion, each wire of the plurality of wires being disposed in a substantially spiral arrangement about a respective channel; and one or more mounting holes for mounting the mask in a fixed position relative to a solid target material and a substrate.

10. The mask of claim 8, wherein the channels are defined by a top layer and a bottom layer of the fixed mask portion.

11. The mask of claim 9, wherein the wires generate a magnetic field in the channels when electrical current is passed through the wires.

12. The mask of claim 11, wherein the wires are electrically connected to a computer or integrated circuit such that the magnetic field can be precisely controlled.

13. The mask of claim 9, further comprising a hard ferromagnetic material placed within the channels.

\* \* \* \* \*

UNITED STATES PATENT AND TRADEMARK OFFICE
CERTIFICATE OF CORRECTION

| | | |
|---|---|---|
| PATENT NO. | : 7,179,335 B2 | Page 1 of 1 |
| APPLICATION NO. | : 10/695343 | |
| DATED | : February 20, 2007 | |
| INVENTOR(S) | : Freeman et al. | |

It is certified that error appears in the above-identified patent and that said Letters Patent is hereby corrected as shown below:

Column 6
Line 21, change "260" to --270--

Column 9
Line 4, change "The mask of claim 8" to --The mask of claim 9--

Signed and Sealed this

Twenty-third Day of March, 2010

David J. Kappos
*Director of the United States Patent and Trademark Office*